(12) United States Patent
Oshima et al.

(10) Patent No.: US 9,170,284 B2
(45) Date of Patent: Oct. 27, 2015

(54) A.C. POWER MEASURING APPARATUS AND A.C. POWER MEASURING METHOD

(71) Applicant: FUJITSU LIMITED, Kawasaki-shi, Kanagawa (JP)

(72) Inventors: Hirotaka Oshima, Machida (JP); Akio Ito, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/612,644

(22) Filed: Feb. 3, 2015

(65) Prior Publication Data

US 2015/0145500 A1    May 28, 2015

Related U.S. Application Data

(63) Continuation of application No. PCT/JP2012/070917, filed on Aug. 17, 2012.

(51) Int. Cl.
*G01R 21/00* (2006.01)
*G01R 21/133* (2006.01)
*G01R 1/07* (2006.01)
(Continued)

(52) U.S. Cl.
CPC .............. *G01R 21/006* (2013.01); *G01R 1/07* (2013.01); *G01R 19/0084* (2013.01); *G01R 21/133* (2013.01); *G01R 25/00* (2013.01)

(58) Field of Classification Search
CPC ....... G01R 21/06; G01R 21/133; G01R 11/17
See application file for complete search history.

(56) References Cited

U.S. PATENT DOCUMENTS

2010/0301837 A1  12/2010  Higuma
2011/0184680 A1*  7/2011  Imaizumi ............... G01R 27/02
                                                      702/65

(Continued)

FOREIGN PATENT DOCUMENTS

JP    H10-14135        1/1998
JP    2005-43232 A1    2/2005
JP    2006-184090 A1   7/2006

(Continued)

OTHER PUBLICATIONS

International Search Report for International Application No. PCT/JP2012/070917 dated Dec. 4, 2012.

*Primary Examiner* — Tung X Nguyen
*Assistant Examiner* — Adam Clarke
(74) *Attorney, Agent, or Firm* — Kratz, Quintos & Hanson, LLP

(57) ABSTRACT

An A.C. power measuring apparatus includes a voltage detecting unit that detects voltage waveforms of each of phases of a set of insulated cables for supplying a three-phase A.C. power to a load, by performing a contactless measurement by electrostatic capacitance coupling, and a current detecting unit that detects current waveforms of the set of insulated tables, by performing a contactless measurement by electromagnetic induction coupling. The apparatus further includes a processing unit that computes a power to be supplied to the load, based on line-to-line voltage waveforms, the current waveforms, and prescribed voltage values, by normalizing the voltage waveforms of each of the phases so that as amplitude ratio of the voltage waveforms becomes in accordance with a grounding type of the three-phase A.C. power, and obtaining the line-to-line voltages of the set of three insulated cables based on the normalized voltage waveforms of each of the phases.

8 Claims, 14 Drawing Sheets

(51) Int. Cl.
*G01R 19/00* (2006.01)
*G01R 25/00* (2006.01)

(56) References Cited

U.S. PATENT DOCUMENTS

2013/0338954 A1* 12/2013 Seki .................. G01R 19/2513
702/75

2014/0067299 A1* 3/2014 Lu ...................... G06K 9/00536
702/65

FOREIGN PATENT DOCUMENTS

JP 2006-343109 A1 12/2006
WO 2009/099082 A1 8/2009

* cited by examiner

FIG.8
| GROUNDING TYPE | a-PHASE | b-PHASE | c-PHASE |
|---|---|---|---|
| Y-CONNECTION | 0° | 120° | 240° |
| Δ-CONNECTION | 0° | – | 300° |
| V-CONNECTION | 0° | 180° | 270° |
FIG.9
| GROUNDING TYPE | a-PHASE | b-PHASE | c-PHASE |
|---|---|---|---|
| Y-CONNECTION | 1 | 1 | 1 |
| Δ-CONNECTION | 1 | 0 | 1 |
| V-CONNECTION | 1 | 1 | √3 |
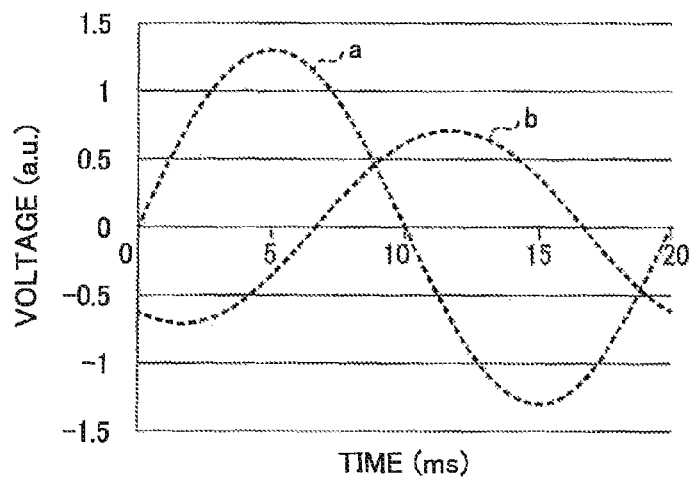
FIG.10
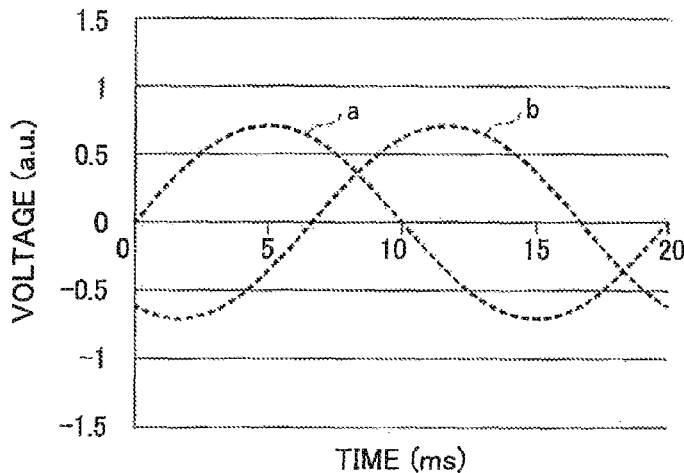
FIG.11

A.C. POWER MEASURING APPARATUS AND A.C. POWER MEASURING METHOD

CROSS-REFERENCE TO RELATED APPLICATIONS

This application is a continuation application of International Application No. PCT/JP2012/070917 filed on Aug. 17, 2012 and designated the U.S., the entire contents of which are incorporated herein by reference.

FIELD

The embodiments discussed herein are related to an A.C. power measuring apparatus and an A.C. power measuring method.

BACKGROUND

Actual power consumption (active power) caused by a load such as an electronic apparatus or the like, can be obtained from a product of apparent power and power factor.

Information related to a phase error between a voltage and a current is required when obtaining the power factor.

For this reason, when obtaining the active power, a measurement is generally performed by directly connecting measuring terminals (or taps) of a measuring device to conductor wires of a cable.

Japanese Laid-open Patent Publication No. 2006-343109, Japanese Laid-Open Patent Publication No. 2006-184090, and International Publication Pamphlet No. WO2009/099032 are examples of related art.

However, when connecting the measuring terminals to the conductor wires of the cable, there are cases in which a power supply or the like of the load must be turned OFF for safety reasons or the like.

SUMMARY

Accordingly, it is an object in one aspect of the embodiment to provide an A.C. power measuring apparatus that can perform contactless (or non-contact) and accurate measurement of A.C. power with respect to conductor wires of a cable.

According to one aspect of the present embodiment, an A.C. power measuring apparatus includes a voltage detecting unit configured to detect voltage waveforms of each of phases of a set of three insulated cables for supplying a three-phase A.C. power to a load, by performing a contactless measurement by electrostatic capacitance coupling, without making contact with the insulated cable; a current detecting unit configured to detect current waveforms of the set of three insulated cables, by performing a contactless measurement by electromagnetic induction coupling, without making contact with the insulated cable; and a processing unit configured to compute a power to be supplied to the load, based on line-to-line voltage waveforms, the current waveforms, and prescribed voltage values, by normalizing the voltage waveforms of each of the phases so that an amplitude ratio of the voltage waveforms becomes in accordance with a grounding type of the three-phase A.C. power, and obtaining the line-to-line voltages of the set of three insulated cables based on the normalized voltage waveforms of each of the phases.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a diagram illustrating phase errors amongst each of the phases for each of the grounding types;

FIG. 9 is a diagram illustrating amplitude ratios for each of the grounding types;

FIG. 10 is a graph illustrating voltage waveforms of each of the phases acquired by voltage sensors;

FIG. 11 is a graph illustrating normalized voltage waveforms;

DESCRIPTION OF EMBODIMENTS

Preferred embodiments of the present invention will be described with reference to the accompanying drawings.

A description will now be given of the A.C. power measuring apparatus and the A.C. power measuring method in each embodiment according to the present invention.

It is conceivable to make a contactless measurement of a current waveform and a voltage waveform with respect to conductor wires of an insulated cable.

When making the contactless measurement of the current waveform, a current clamp may be used, and the current waveform may be accurately measured by electromagnetic induction coupling.

On the other hand, when making the contactless measurement of the voltage waveform, electrodes used for voltage detection may be arranged to be near or in contact with an insulator of the insulated cable, and the voltage waveform may be measured by electrostatic capacitance coupling.

Figure 18:
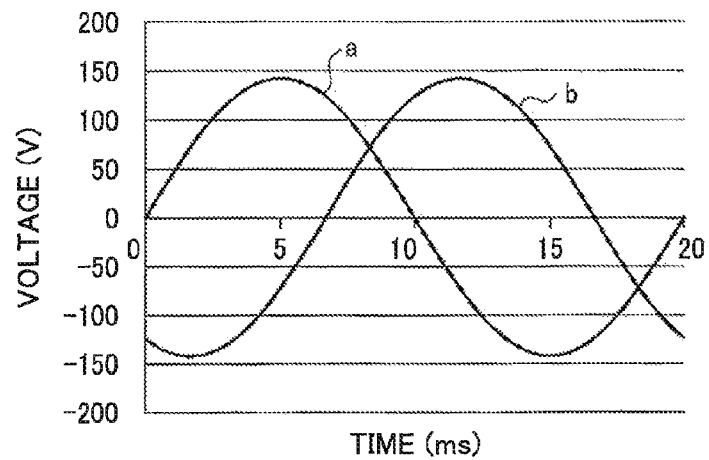
FIG. 18 is a graph illustrating examples of voltage waveforms in each of the phases for an actual cable.

FIG. 18 is a graph illustrating examples of voltage waveforms in each of phases for an actual cable. In order to simplify the description, FIG. 18 illustrates only the voltage waveforms of a-phase and b-phase amongst a three-phase A.C. (Alternating Current). In FIG. 18, an abscissa indicates the time, and an ordinate indicates the voltage.

Because FIG. 18 illustrates the voltage waveforms for a Y-connection, an amplitude of the voltage waveform of the a-phase is equal to an amplitude of the voltage waveform of the b-phase.

Figure 19:
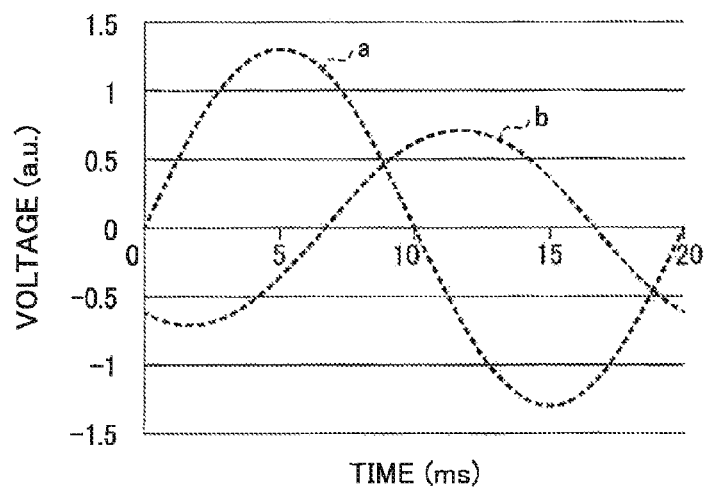
FIG. 19 is a graph illustrating voltage waveforms in each of the phases acquired from, voltage sensors.

FIG. 19 is a graph illustrating voltage waveforms in each of the phases acquired from voltage sensors. In FIG. 19, an abscissa indicate the time, and an ordinate indicates the voltage.

As illustrated in FIG. 19, there are cases in which the amplitude of the voltage waveform of the a-phase acquired by the voltage sensor and the amplitude of the voltage waveform of the b-phase acquired by the voltage sensor become mutually different.

The amplitude of the voltage waveform of the a-phase and the amplitude of the voltage waveform of the b-phase become different due to differences in electrostatic capacitances (coupling capacitances) between electrodes on the voltage sensor side and conductor wires of the cable, or the like. The differences in the electrostatic capacitances are caused by differences in distances between the electrodes on the voltage sensor side and the conductor wires of the cable, or the like.

Figure 20:
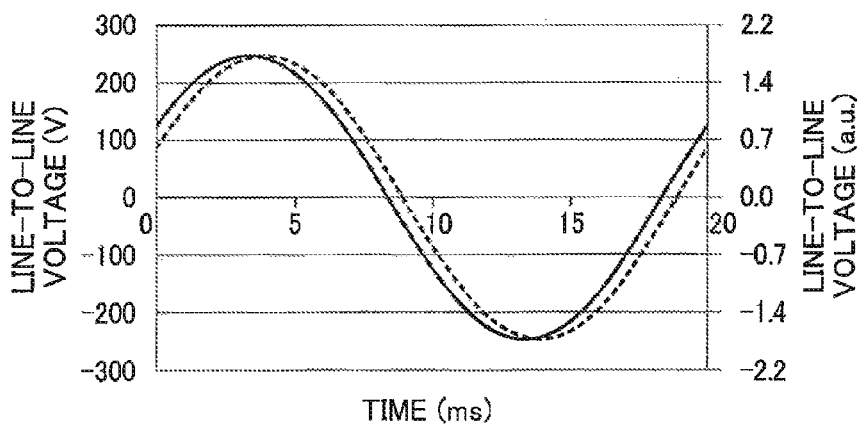
FIG. 20 is a diagram illustrating a line-to-line voltage waveform between a-phase and b-phase.

FIG. 20 is a diagram illustrating a line-to-line voltage waveform between the a-phase and the b-phase. In FIG. 20, a solid line indicates the line-to-line voltage of the actual cable. On the other hand, a dotted line in FIG. 20 indicates a line-to-line voltage waveform that is computed based on the voltage waveforms acquired by the voltage sensors. In FIG. 20, an abscissa indicates the time. A left ordinate in FIG. 20 indicates the voltage of the waveform indicated by the solid line. A right ordinate in FIG. 20 indicates the voltage of the waveform indicated by the dotted line.

As may be seen from FIG. 20, a phase error is generated between the line-to-line voltage waveform of the actual cable and the line-to-line voltage based on the voltage waveforms acquired by the voltage sensors.

In a case in which power is computed using the line-to-line voltage waveform having the phase error, a computed result of the power may include a large error.

Embodiment

Figure 1:
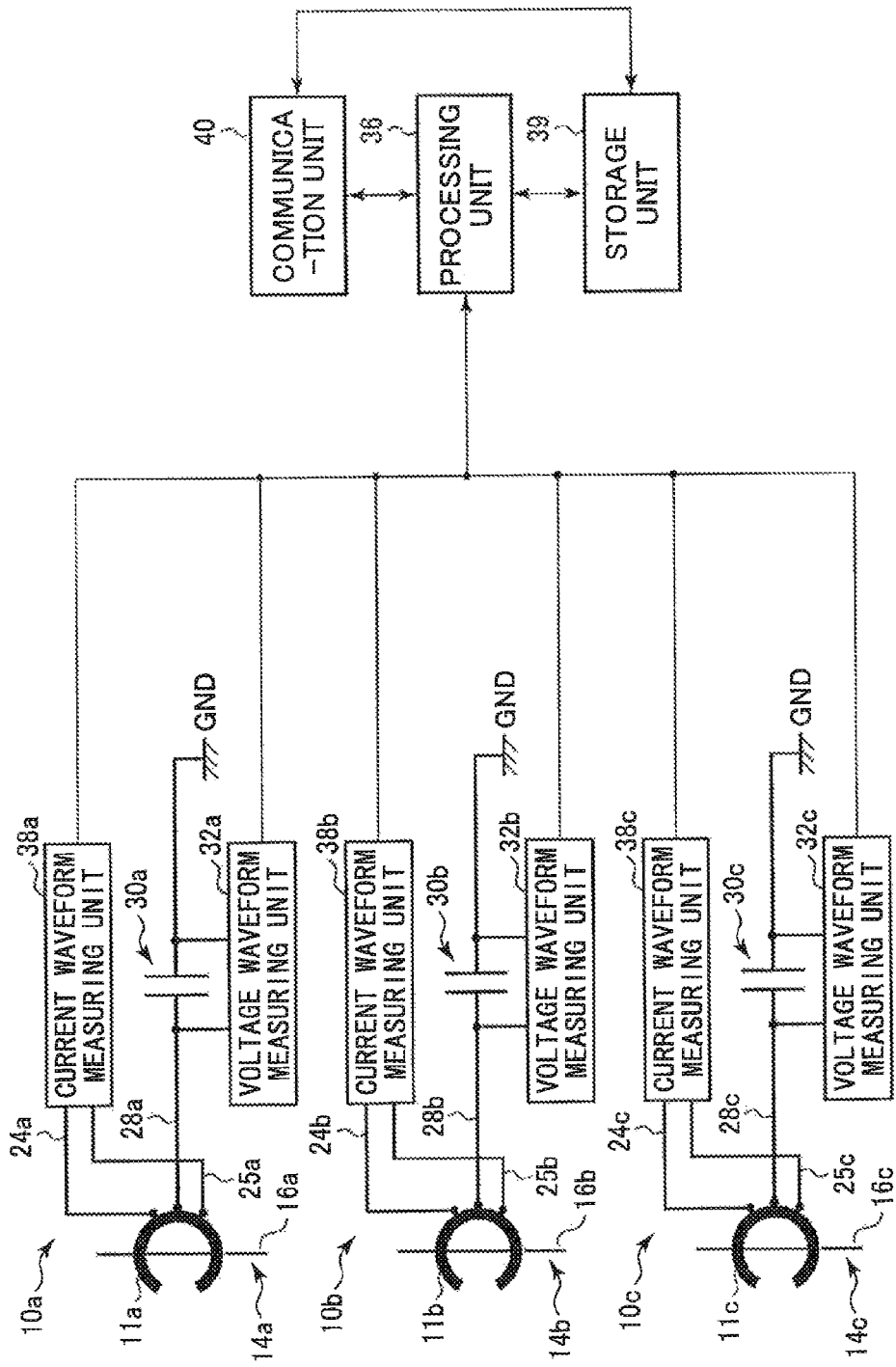
FIG. 1 is a circuit diagram illustrating an A.C. power measuring apparatus in one embodiment.

A description will be given of the A.C. power measuring apparatus and the A.C. power measuring method in one embodiment, by referring to FIGS. 1 through 17. FIG. 1 is a circuit diagram illustrating an A.C. power measuring apparatus in one embodiment.

The A.C. power measuring apparatus in this embodiment includes three input, circuits 10a, 10b, and 10c, as illustrated in FIG. 1. The three input circuits 10a, 10b, and 10c are provided in order to enable measurement of three-phase A.C. power. This embodiment will be described by referring to an example in which the three-phase A.C. power is supplied to a load (not illustrated).

Figure 2:
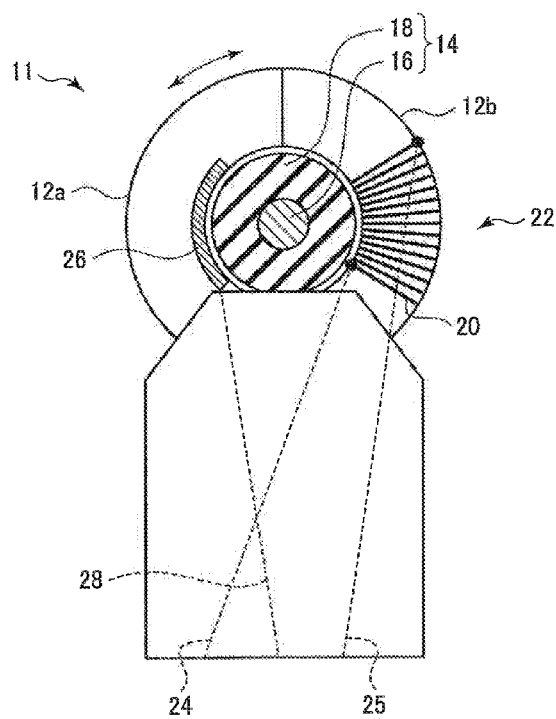
FIG. 2 is a diagram illustrating an example of a clamp part used in one embodiment.

FIG. 2 is a diagram illustrating an example of a clamp part used in this embodiment.

A main clamp part body (support part) supports a pair of magnetic cores 12a and 12b. At least one of the pair of magnetic cores 12a and 12b is movable. For example, the magnetic core 12a is movable in directions of arrows illustrated in FIG. 2. Each of the magnetic cores 12a and 12b is formed to have a semi-annular shape, for example.

A clamp part 11 is provided to clamp a cable (insulated cable) 14 for supplying A.C. power. The insulated cable 14 includes a conductor wire (conductor) 16 that is covered by an insulator 18. FIG. 2 illustrates a state in which the cable 14 is clamped by the pair of magnetic cores 12a and 12b.

When the cable 14 is clamped by the pair of magnetic cores 12a and 12b of the clamp part 11, both ends of the magnetic core 12a and both ends of the magnetic core 12b mutually oppose each other, and the cable 14 becomes surrounded by a ring-shaped magnetic path.

The magnetic cores 12a and 12b are made of a high permeable magnetic material. More particularly, the magnetic cores 12a and 12b are made of a material such as ferrite, silicon steel plate, permalloy, or the like.

A wire 20 is wound around the magnetic core 12b, to thereby form a coil 22. The coil 22 is used to perform a contactless measurement of a current (current waveform) flowing through the cable 14 by electromagnetic induction coupling, without making contact with the conductor wire 16 of the cable 14. By detecting a magnetic flux flowing through the ring-shaped magnetic path formed by the pair of magnetic cores 12a and 12b, using the coil 22, it is possible to detect the current flowing through the cable 14. Leader lines (wires, signal lines) 24 and 25 are connected to both ends of the coil 22.

An electrode (conductor) 26 is provided on an inner side of the magnetic core 12a. The electrode 26 is used to perform a contactless measurement of a voltage (voltage waveform) of the cable 14 by capacitance coupling (electrostatic capacitance coupling), without making contact with the wire 16 of the cable 14. The clamp part 11 includes a mechanism to press the electrode 26 against the insulator 18 of the cable 14 when clamping the cable 14. For this reason, when the cable 14 is clamped by the clamp part 11, the electrode 26 is arranged to be near or in contact with the insulator 18 of the cable 14. The electrode 26 is made of a material such as copper (Cu), for example. A leader line (wire, signal line) 28 is connected to the electrode 26.

As illustrated in FIG. 1, clamp parts 11a, 11b, and 11c are provided in the input circuits 10a, 10b, and 10c, respectively. The clamp part 11 illustrated in FIG. 2, for example, is used for each of the clamp parts 11a, 11b, and 11c.

The input circuits 10a, 10b, and 10c are provided with capacitative elements (condensers, capacitors) 30a, 30b, and 30c, respectively. The electrodes of the clamp parts 11a, 11b, and 11c and first ends of the capacitative elements 30a, 30b, and 30c are electrically connected via wires 28a, 28b, and 28c, respectively.

When cables 14a, 14b, and 14c are clamped by the clamp parts 11a, 11b, and 11c, respectively, the first ends of the capacitative elements 30a, 30b, and 30c are coupled to the wires 14a, 14b, and 14c by electrostatic capacitance coupling, respectively.

Second (or other) ends of the capacitative elements 30a, 30b, and 30c are electrically connected to ground (ground potential, ground terminal) GND, respectively.

The ground GND of the A.C. power measuring apparatus in this embodiment is is electrically connected to ground (not illustrated) provided on a switchboard (not illustrated) or the like.

In a case in which an electrostatic capacitance $C_0$ between conductor wires 16a, 16b, and 16c of the cables 14a, 14b, and 14c and the electrodes 26 of the clamp parts 11a, 11b, and 11c, respectively, is approximately 10 pF, for example, an electrostatic capacitance $C_1$ of the capacitative elements 30a, 30b, and 30c is set to approximately 10 nF, for example. The electrostatic capacitance $C_1$ of the capacitative elements 30a, 30b, and 30c is preferably not excessively large compared to the electrostatic capacitance $C_0$ between conductor wires 16a, 16b, and 16c and the electrodes 26, so that a large voltage is applied across the first and second ends (both ends) of the capacitative elements 30a, 30b, and 30c.

Voltage waveform measuring units (voltage signal measuring units) 32a, 32b, and 32c are connected to the capacitative elements 30a, 30b, and 30c, respectively. The voltage waveform measuring units 32a, 32b, and 32c measure voltages (voltage waveforms, voltage signals) $X_a(t)$, $X_b(t)$, and $X_c(t)$ across the first and second ends (both ends) of the capacitative elements 30a, 30b, and 30c, respectively. The voltage waveform measuring units 32a, 32b, and 32c, the capacitative elements 30a, 30b, and 30c, and the clamp parts 11a, 11b, and 11c form voltage sensors (voltage detectors), respectively. The voltage waveform measuring units 32a, 32b, and 32c successively measure instantaneous values $X_a(t)$, $X_b(t)$, and $X_c(t)$ of the voltages across the first and second ends (both ends) of the capacitative elements 30a, 30b, and 30c, respectively, at predetermined time intervals. That is, the voltage waveform measuring units 32a, 32b, and 32c can successively measure the instantaneous values $X_a(t)$, $X_b(t)$, and $X_c(t)$ of the voltages across the first and second ends (both ends) of the capacitative elements 30a, 30b, and 30c, respectively, at predetermined time resolutions. A frequency of the A.C. power supply is 50 Hz or 60 Hz, for example. The time intervals at which the voltages $X_a(t)$, $X_b(t)$, and $X_c(t)$ across the first and second ends (both ends) of the capacitative elements 30a, 30b, and 30c are measured by the voltage waveform measuring units 32a, 32b, and 32c, respectively, are set to approximately 200 μs, for example. By measuring the voltages $X_a(t)$, $X_b(t)$, and $X_c(t)$ across the first and second ends (both ends) of the capacitative elements 30a, 30b, and 30c at such time intervals, data of the voltage waveforms $X_a(t)$, $X_b(t)$, and $X_c(t)$ having a sufficient time resolution can be obtained.

Input impedances of the voltage waveform measuring units 32a, 32b, and 32c are preferably sufficiently large with respect to impedances of the capacitative elements 30a, 30b, and 30c, respectively. The input impedances of the voltage waveform measuring units 32a, 32b, and 32c are set sufficiently large, in order to prevent a phase error from being generated in the voltages applied across the first and second ends (both ends) of the capacitative elements 30a, 30b, and 30c, and to prevent the voltages from becoming excessively small, so that a sufficient measuring accuracy can be secured. For example, the input impedances of the voltage waveform measuring units 32a, 32b, and 32c are set to two or more times the impedances of the capacitative elements 30a, 30b, and 30c. More preferably, the input impedances of the voltage waveform measuring units 32a, 32b, and 32c are set, for example, to five or more times the impedances of the capacitative elements 30a, 30b, and 30c.

Measurements of the voltage waveforms $X_a(t)$, $X_b(t)$, and $X_c(t)$ by the voltage waveform measuring units 32a, 32b, and 32c are controlled by the processing unit 36. For example, a CPU (Central Processing Unit) operated by a predetermined computer program may be used for the processing unit 36. The voltage waveform measuring units 32a, 32b, and 32c acquire the data of the voltage waveforms $X_a(t)$, $X_b(t)$, and $X_c(t)$ according to instructions from the processing unit 36, and output the acquired data of the voltage waveforms $X_a(t)$, $X_b(t)$, and $X_c(t)$ to the processing unit 36. The processing unit 36 stores the acquired data of the voltage waveforms $X_a(t)$, $X_b(t)$, and $X_c(t)$ in a storage unit (database) 39. For example, a memory such as a RAM (Random Access Memory) or the like, an HDD (Hard Disk Drive), or the like may be used for the storage unit 39.

Figure 3:
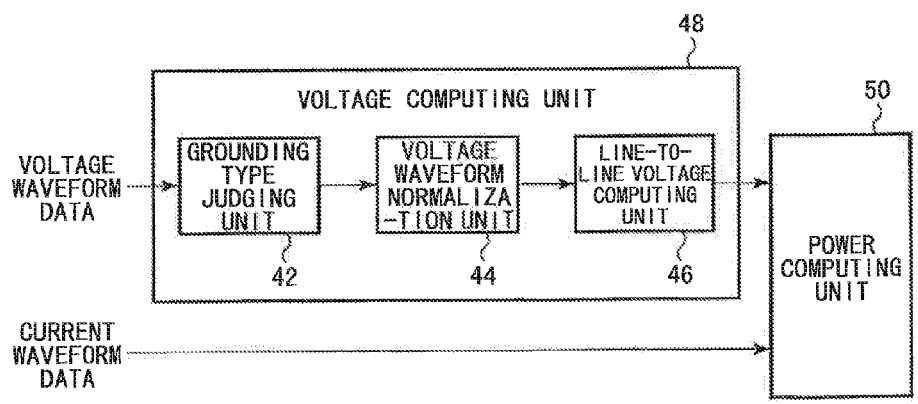
FIG. 3 is a functional block diagram illustrating the A.C. power measuring apparatus in one embodiment.

FIG. 3 is a functional block diagram illustrating the A.C. power measuring apparatus in this embodiment.

A grounding type judging unit 42, a voltage waveform normalization unit 44, a line-to-line voltage computing unit 46, a voltage computing unit 48, and a power computing unit 50 illustrated in FIG. 3 may be realized by the processing unit 36 illustrated in FIG. 1, for example.

The voltage computing unit 48 is formed by the grounding type judging unit 42, the voltage waveform normalization unit 44, and the line-to-line voltage computing unit 46.

The grounding type judging unit 42 judges the grounding type based on the data of the voltage waveforms (voltage waveform data) of each of the phases acquired by the voltage waveform measuring units 32a, 32b, and 32c. The grounding type may be judged based on the phase error amongst each of the voltage waveforms, for example.

Figure 4A:
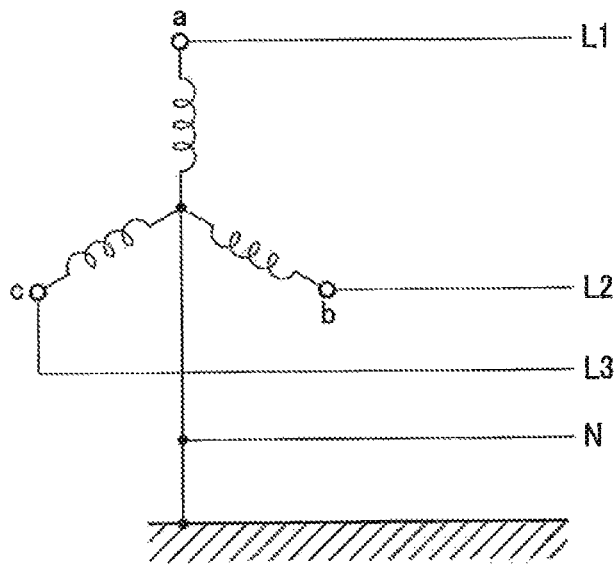
FIGS. 4A and 4B are diagrams illustrating grounding types.
Figure 4B:
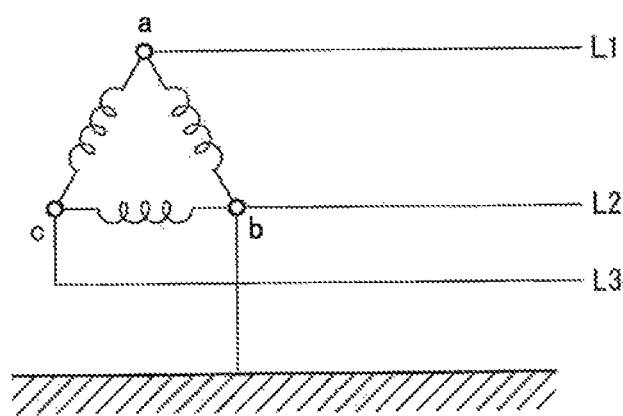
Figure 5:
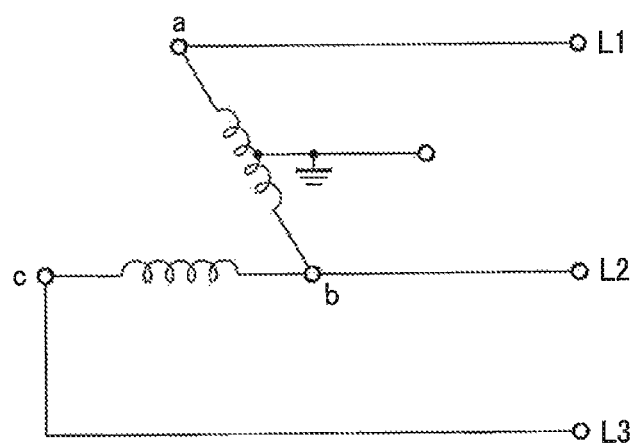
FIG. 5 is a diagram illustrating a grounding type.

FIGS. 4A, 4B, and 5 are diagrams illustrating grounding types. FIG. 4A illustrates a grounding type employing a Y-connection, FIG. 4B illustrates a grounding type employing a Δ-connection, and FIG. 5 illustrates a grounding type employing a V-connection.

Figure 6A:
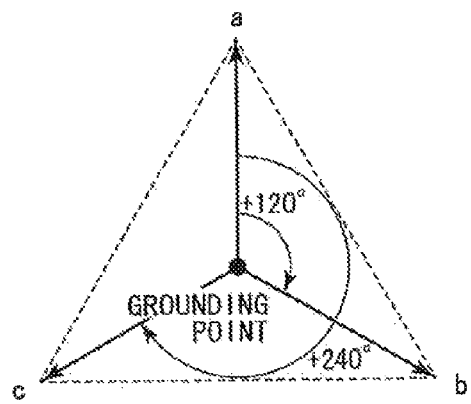
FIGS. 6A, 6B, and 6C are diagrams illustrating voltage vectors of the grounding types.
Figure 6B:
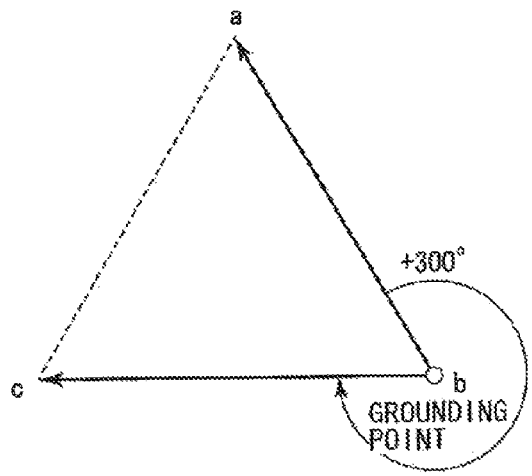
Figure 6C:
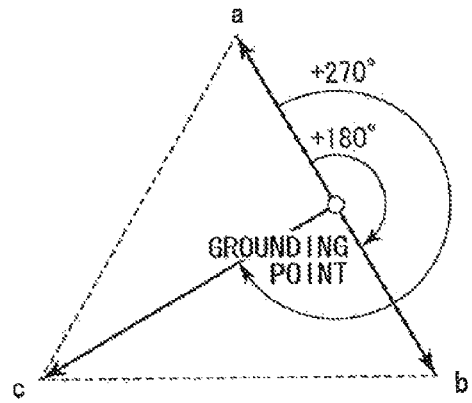

FIGS. 6A, 6B, and 6C are diagrams illustrating voltage vectors of the grounding types. FIG. 6A illustrates the voltage vectors of the grounding type employing the Y-connection, FIG. 6B illustrates the voltage vectors of the grounding type employing the Δ-connection, and FIG. 6C illustrates the voltage vectors of the grounding type employing the V-connection.

In FIGS. 6A, 6B, and 6C, lengths of the vectors correspond to amplitudes of the voltage waveforms $X_a(t)$, $X_b(t)$, and $X_c(t)$. In addition, relative angles of the vectors illustrated in FIGS. 6A, 6B, and 6C correspond to the phase errors. FIGS. 6A, 6B, and 6C illustrate the phase errors with reference to the a-phase.

Figure 7A:
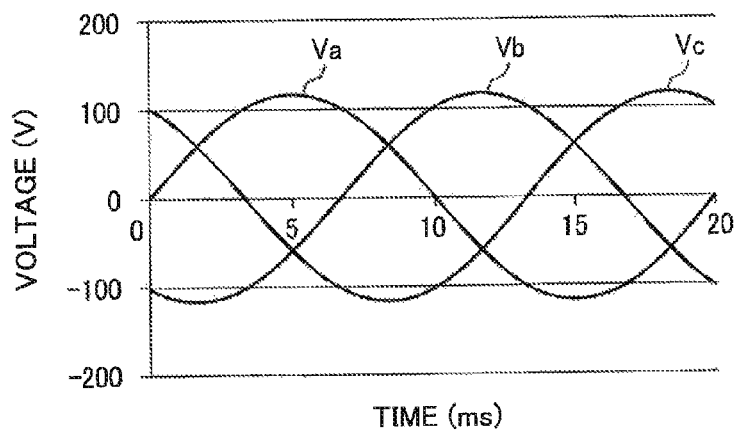
FIGS. 7A, 7B, and 7C are graphs illustrating voltage waveforms of each of phases.
Figure 7B:
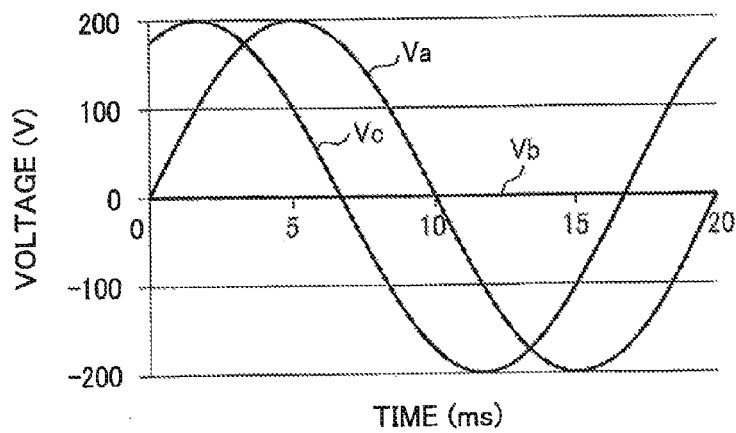
Figure 7C:
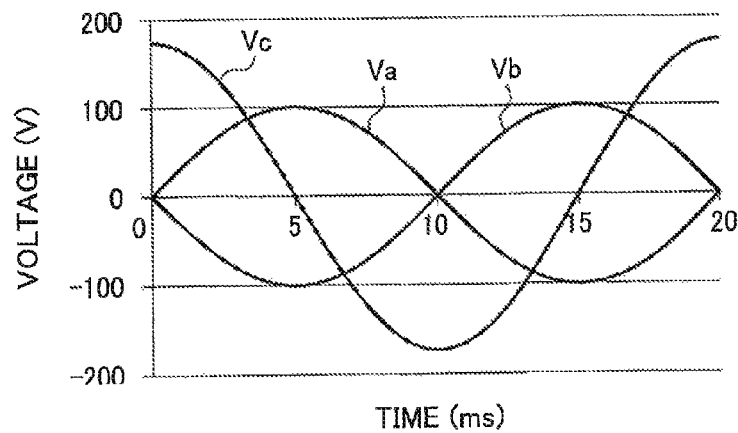

FIGS. 7A, 7B, and 7C are graphs illustrating the voltage waveforms of each of phases. FIG. 7A illustrates the voltage waveforms of each of the phases for the grounding type employing the Y-connection, FIG. 6B illustrates the voltage waveforms of each of the phases for the grounding type employing the Δ-connection, and FIG. 6C illustrates the voltage waveforms of each of the phases for the grounding type employing the V-connection. In FIGS. 7A, 7B, and 7C, Va denotes the voltage of the a-phase, Vb denotes the voltage of the b-phase, and Vc denotes the voltage of the c-phase.

As illustrated in FIG. 7A, in the case of the grounding type employing the Y-connection, the phase error between the voltage waveforms of the a-phase and the b-phase is 120°, and the phase error between the voltage waveforms of the a-phase and the c-phase is 240°.

In addition, as illustrated in FIG. 7B, in the case of the grounding type employing the Δ-connection, the phase error between the voltage waveforms of the a-phase and the c-phase is 300°, and the voltage waveforms of the b-phase is 0 V since the b-phase is grounded.

Further, illustrated in FIG. 7C, in the case of the grounding type employing the V-connection, the phase error between the voltage waveforms of the a-phase and the b-phase is 180°, and the phase error between the voltage waveforms of the a-phase and the c-phase is 270°.

FIG. 8 is a diagram illustrating the phase errors amongst each of the phases for each of the grounding types.

As illustrated in FIG. 8, the phase errors of the voltage waveforms amongst each of the phases are mutually different amongst the grounding types employing the Y-connection, the Δ-connection, and the V-connection. For this reason, the grounding type of the three-phase A.C. power supply can be judged based on the phase difference of the acquired voltage waveforms amongst each of the phases.

The phase errors of the voltage waveforms $X_a(t)$, $X_b(t)$, and $X_c(t)$ amongst each of the phases may be obtained by comparing positions of zero-crossing points of the voltage waveforms $X_a(t)$, $X_b(t)$, and $X_c(t)$, for example. In this case, an average value of the voltage waveforms $X_a(t)$, $X_b(t)$, and $X_c(t)$ is regarded as a zero point, and a point where a part of a positive slope of the voltage waveform and the zero point intersect is regarded as the zero-crossing point. The phase errors of the voltage waveforms $X_a(t)$, $X_b(t)$, and $X_c(t)$ amongst each of the phases can be obtained by dividing positional differences (time differences) of the zero-crossing points by the period, in order to convert the positional differences of the zero-crossing points into the phase errors.

In addition, the amplitude of the voltage waveform of one phase may be 0 V. However, in this case, the grounding type may be judged as being the grounding type employing the Δ-connection if the phase error of the voltage waveforms of the other two phases is 300°, and a trouble of the clamp may otherwise be judged.

The voltage waveform normalization unit 44 normalizes the acquired voltage waveforms $X_a(t)$, $X_b(t)$, and $X_c(t)$ according to the grounding type.

The electrostatic capacitances between the conductor wires 16a, 16b, and 16c of the cables 14a, 14b, and 14c and the electrodes 26 of the clamp parts 11a, 11b, and 11c vary according to the distances between the electrodes 26 and the conductor wires 16a, 16b, and 16c, or the like. For this reason, when the line-to-line voltage is computed simply using the acquired voltage waveforms $X_a(t)$, $X_b(t)$, and $X_c(t)$, the line-to-line voltage cannot be computed accurately. Hence, in this embodiment, the voltage waveforms $X_a(t)$, $X_b(t)$, and $X_c(t)$ are normalized, and the line-to-line voltage is computed using the normalized voltage waveforms $X_a(t)$, $X_b(t)$, and $X_c(t)$.

FIG. 9 is a diagram illustrating amplitude ratios for each of the grounding types.

As illustrated in FIG. 9, the amplitude ratio of the a-phase, the b-phase, and the c-phase for the grounding type employing the Y-connection is 1:1:1.

In addition, the amplitude ratio of the a-phase, the b-phase, and the c-phase for the grounding type employing the Δ-connection is 1:0:1.

Further, the amplitude ratio of the a-phase, the b-phase, and the c-phase for the grounding type employing the V-connection is $1:1:\sqrt{3}$.

A description will be given of an example in which the normalization is performed with reference to the amplitude of the b-phase.

The amplitude of the acquired voltage waveform of the a-phase is represented by $|X_a|$, the amplitude of the acquired voltage waveform of the b-phase is represented by $|X_b|$, and the amplitude of the acquired voltage waveform of the c-phase is represented by $|X_c|$.

Moreover, the acquired voltage waveform of the a-phase is represented by $X_a(t)$, the acquired voltage waveform of the b-phase is represented by $X_b(t)$, and the acquired voltage waveform of the c-phase is represented by $X_c(t)$.

An amplitude ratio of the a-phase with respect, to the b-phase is represented by $V_{ratio\_a}$, and an amplitude ratio of the c-phase with respect to the b-phase is represented by $V_{ratio\_c}$.

Accordingly, a normalized voltage waveform $X_a'(t)$ of the a-phase can be represented by the following formula (1).

$$X_a'(t) = V_{ratio\_a} \times (|X_b|/|X_a|) \times X_a(t) \tag{1}$$

In addition, a normalized voltage waveform $X_c'(t)$ of the c-phase can be represented by the following formula (2).

$$X_c'(t) = V_{ratio\_c} \times (|X_b|/|X_c|) \times X_c(t) \tag{2}$$

In the case of the grounding type employing the Y-connection, the value of the amplitude ratio $V_{ratio\_a}$ is 1, and the value of the amplitude ratio $V_{ratio\_c}$ is 1.

Moreover, in the case of the grounding type employing the V-connection, the value of the amplitude ratio $V_{ratio\_a}$ is 1, and the value of the amplitude ratio $V_{ratio\_c}$ is $\sqrt{3}$.

In the case of the grounding type employing the Δ-connection in which the b-phase is grounded, the amplitude of the b-phase cannot be used as the reference. When the amplitude of the b-phase cannot be used as the reference, the amplitude of the a-phase, for example, may be used as the reference. When the amplitude of the a-phase is used as the reference, a normalized voltage waveform $X_c'(t)$ of the c-phase can be represented by the $$X_c'(t) = V_{ratio\_c} \times (|X_a|/|X_c|) \times X_c(t) \tag{3}$$

In the formula (3) above, $V_{ratio\_c}$ represents the amplitude ratio of the c-phase with respect to the a-phase. In the case of the grounding type employing the Δ-connection, the value of the amplitude ratio $V_{ratio\_c}$ of the c-phase with respect to the a-phase is 1.

The data of the normalized voltage waveforms $X_a'(t)$ and $X_c'(t)$ can be obtained in the manner described above.

The line-to-line voltage computing unit 46 computes the line-to-line voltages of the cables 14a, 14b, and 14c amongst each of the phases.

A description will be given of a case in which the line-to-line voltage is computed with reference to the b-phase.

A line-to-line voltage $Z_{ab}(t)$ between the a-phase and the b-phase can be represented by the following formula (4).

$$Z_{ab}(t) = X_a'(t) - X_b(t) \tag{4}$$

In addition, a line-to-line voltage $Z_{cb}(t)$ between the c-phase and the b-phase can be represented by the following formula (4).

$$Z_{cb}(t) = X_c'(t) - X_b(t) \tag{5}$$

FIG. 10 is a graph illustrating voltage waveforms of each of the phases acquired, by the voltage sensors. In FIG. 10, the abscissa indicates the time, and the ordinate indicates the voltage. In order to simplify the description for the sake of convenience, FIG. 10 illustrates only the voltage waveforms of the a-phase and the b-phase.

FIG. 10 illustrates the voltage waveforms for the case in which the grounding type employs the Y-connection. However, in the actual cables, the amplitude of the voltage waveform of the a-phase and the amplitude of the voltage waveform of the b-phase are the same.

As illustrated in FIG. 10, the amplitude of the voltage waveform of the a-phase acquired by the voltage sensor, and the amplitude of the voltage waveform of the b-phase acquired by the voltage sensor may become mutually different.

FIG. 11 is a graph illustrating the normalized voltage waveforms. In order to simplify the description for the sake of convenience, FIG. 11 illustrates only the voltage waveforms of the a-phase and the b-phase. In FIG. 11, the abscissa indicates the time, and the ordinate indicates the voltage.

As illustrated in FIG. 11, the amplitude of the normalized voltage waveform of the a-phase and the amplitude of the normalized voltage waveform of the b-phase are the same.

Figure 12:
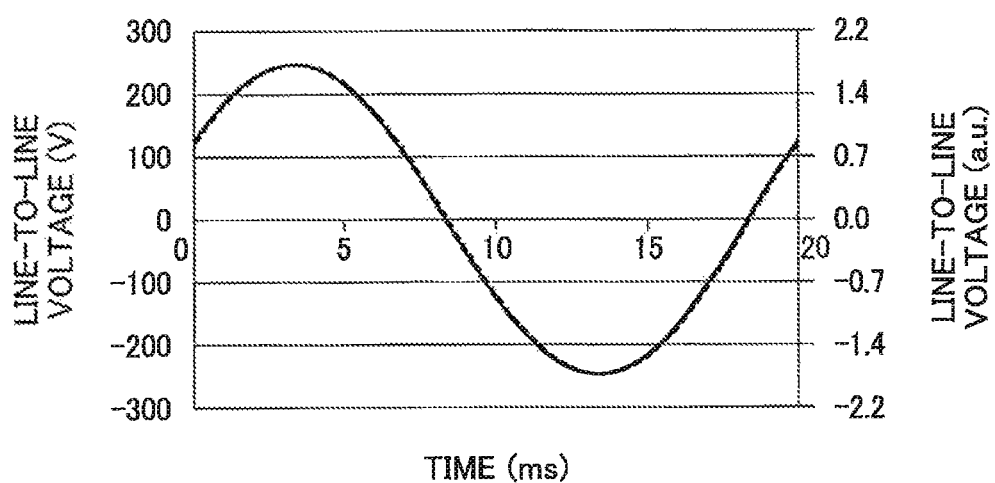
FIG. 12 is a diagram illustrating a line-to-line voltage waveform between a-phase and b-phase.

FIG. 12 is a diagram illustrating the line-to-Line voltage waveform between the a-phase and the b-phase. In FIG. 12, a solid line represents the line-to-line voltage waveform in the actual cable, and a dotted line represents the line-to-line voltage waveform that is computed based on the voltage waveforms acquired by the voltage sensors. In FIG. 12, the abscissa indicates the time, the left ordinate indicates the voltage corresponding to the waveform indicated by the solid line in FIG. 12, and the right ordinate indicates the voltage corresponding to the waveform indicated by the dotted line in FIG. 12.

As may be seen from FIG. 12, this embodiment can eliminate the phase error between the line-to-line voltage waveform in the actual cable and the line-to-line voltage waveform that is computed based on the voltage waveforms acquired by the voltage sensors.

Figure 13A:
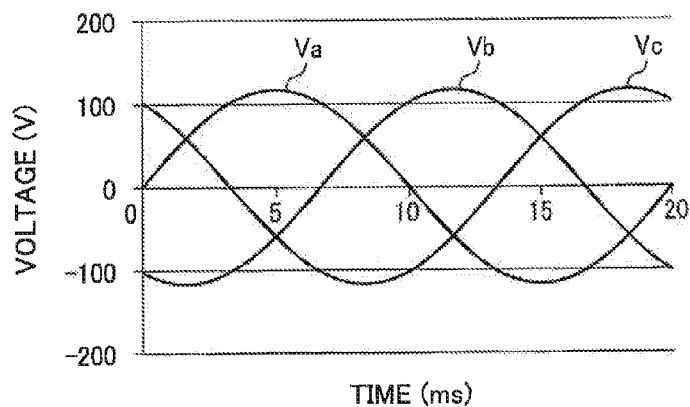
FIGS. 13A, 13B, and 13C are graphs illustrating examples of voltage waveforms for a Y-connection.
Figure 13B:
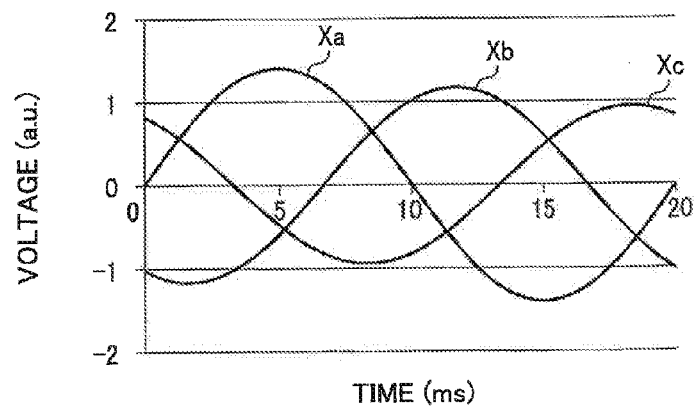
Figure 13C:
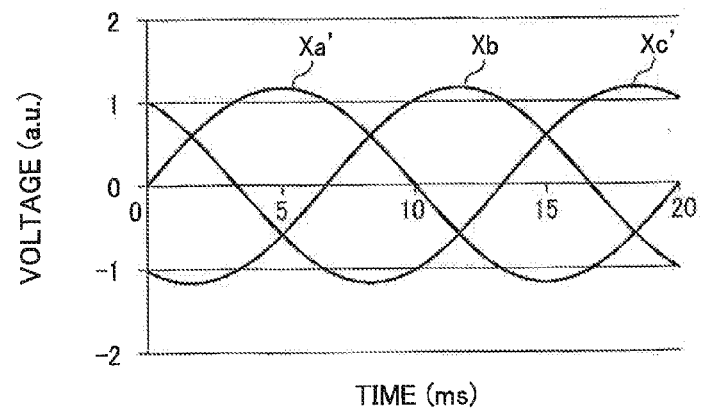

FIGS. 13A, 13B, and 13C are graphs illustrating examples of voltage waveforms for the Y-connection.

FIG. 13A illustrates an example of the voltage waveforms in the actual cables. FIG. 13B illustrates an example of the voltage waveforms acquired by the voltage sensors. FIG. 13C illustrates an example of the normalized voltage waveforms.

As illustrated in FIG. 13B, inconsistencies may be generated in the amplitudes of the voltage waveforms $X_a(t)$, $X_b(t)$, and $X_c(t)$ acquired by the voltage sensors. However, as illustrated in FIG. 13C, the amplitude ratio of each of the phases becomes 1:1:1 by normalizing the acquired voltage waveforms $X_a(t)$, $X_b(t)$, and $X_c(t)$.

FIG. 13C illustrates an example in which the amplitudes of the voltage waveforms $X_a(t)$, $X_b(t)$, and $X_c(t)$ are normalized with reference to the amplitude of the voltage waveform $X_b(t)$ of the b-phase.

Figure 14A:
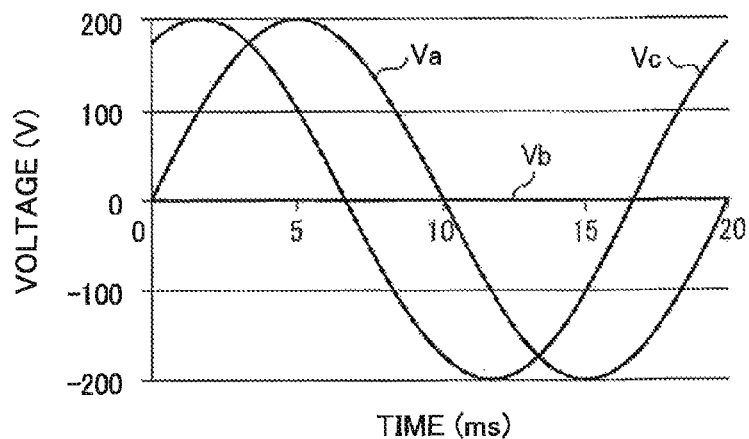
FIGS. 14A, 14B, and 14C are graphs illustrating examples of voltage waveforms for a Δ-connection.
Figure 14B:
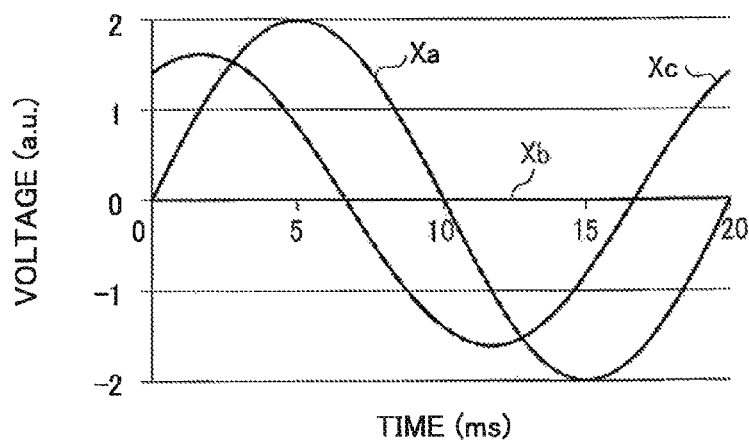
Figure 14C:
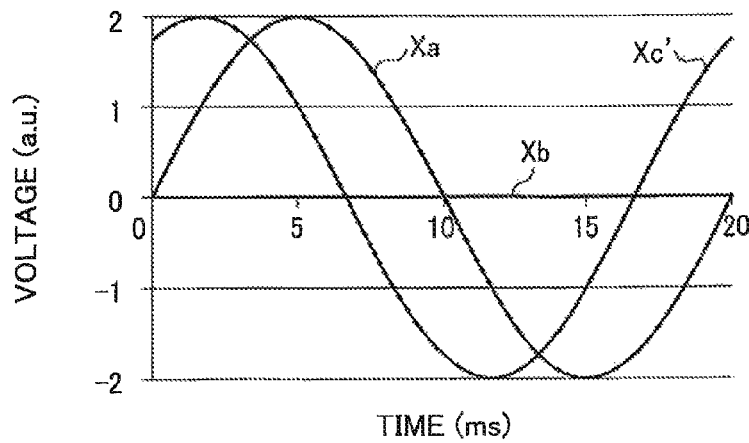

FIGS. 14A, 14B, and 14C are graphs illustrating examples of voltage waveforms for the Δ-connection.

FIG. 14A illustrates an example of the voltage waveforms in the actual cables. FIG. 14B illustrates an example of the voltage waveforms acquired by the voltage sensors. FIG. 14C illustrates an example of the normalized voltage waveforms.

As illustrated in FIG. 14B, inconsistencies may be generated in the amplitudes of the voltage waveforms $X_a(t)$, $X_b(t)$, and $X_c(t)$ acquired by the voltage sensors. However, as illustrated in FIG. 14C, the amplitude ratio of each of the phases becomes 1:0:1 by normalizing the acquired voltage waveforms $X_a(t)$, $X_b(t)$, and $X_c(t)$.

FIG. 14C illustrates an example in which the amplitudes of the voltage waveforms $X_a(t)$, $X_b(t)$, and $X_c(t)$ are normalized with reference to the amplitude of the voltage waveform $X_a(t)$ of the a-phase.

Figure 15A:
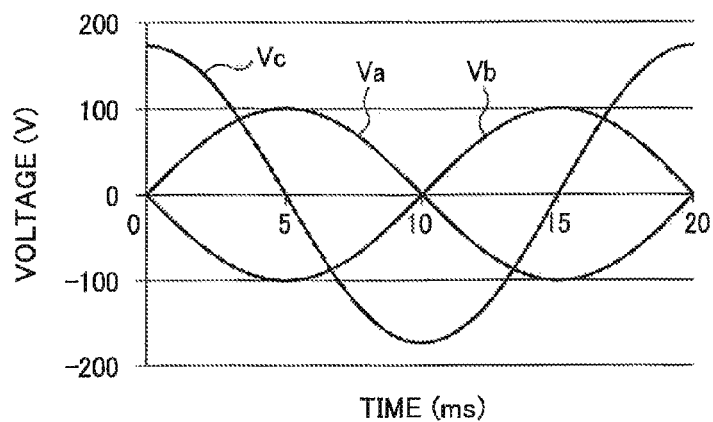
FIGS. 15A, 15B, and 15C are graphs illustrating examples of voltage waveforms for a V-connection.
Figure 15B:
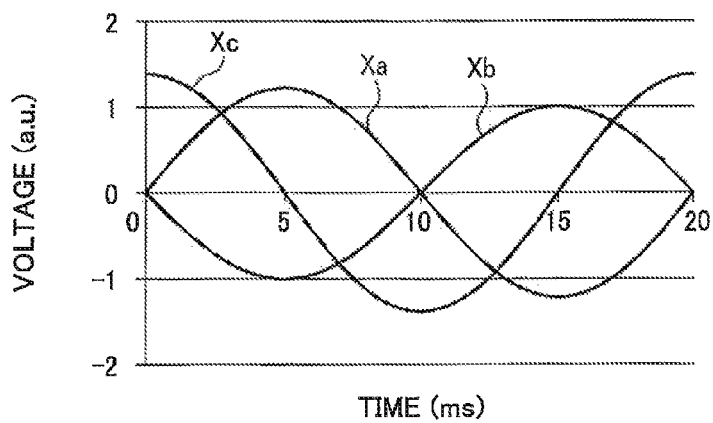
Figure 15C:
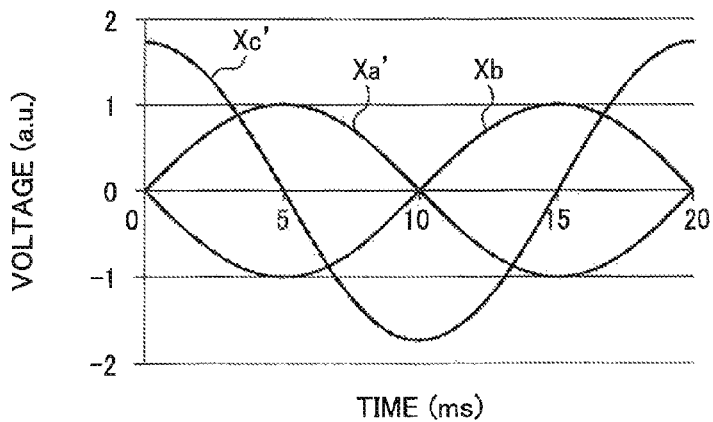

FIGS. 15A, 15B, and 15C are graphs illustrating examples of voltage waveforms for the V-connection.

FIG. 15A illustrates an example of the voltage waveforms in the actual cables. FIG. 15B illustrates an example of the voltage waveforms acquired by the voltage sensors. FIG. 15C illustrates an example of the normalized voltage waveforms.

As illustrated, in FIG. 15B, inconsistencies may be generated in the amplitudes of the voltage waveforms $X_a(t)$, $X_b(t)$, and $X_c(t)$ acquired by the voltage sensors. However, as illustrated in FIG. 15C, the amplitude ratio of each of the phases becomes $1:1:\sqrt{3}$ by normalizing the acquired voltage waveforms $X_a(t)$, $X_b(t)$, and $X_c(t)$.

FIG. 15C illustrates an example in which the amplitudes of the voltage waveforms $X_a(t)$, $X_b(t)$, and $X_c(t)$ are normalized with reference to the amplitude of the voltage waveform $X_b(t)$ of the b-phase.

The input circuits 10a, 10b, and 10c include current waveform measuring units (current signal measuring units) 38a, 38b, and 38c, respectively. Signal lines 24a, 24b, and 24c and signal lines 25a, 25b, and 25c connected to both ends of the coils 22 are connected to the current waveform measuring units 38a, 38b, and 38c, respectively. The current waveform, measuring units 38a, 38b, and 38c measure the currents flowing through the cables 14a, 14b, and 14c, respectively, based on the signals detected by the coils. The current waveform measuring units 38a, 38b, and 38c and the clamp parts 11a, 11b, and 11c form current sensors (current detectors), respectively.

The current waveform measuring units 38a, 38b, and 38c successively measure instantaneous values $I_a(t)$, $I_b(t)$, and $I_c(t)$ of the currents flowing through the cables 14a, 14b, and 14c, respectively, at predetermined time intervals. Accordingly, the current waveform measuring units 38a, 38b, and 38c can successively measure the instantaneous values $I_a(t)$, $I_b(t)$, and $I_c(t)$ of the currents flowing through the cables 14a, 14b, and 14c, respectively, at predetermined time resolutions. Time intervals at which the current waveform measuring units 38a, 38b, and 38c measure the currents $I_a(t)$, $I_b(t)$, and $I_c(t)$ flowing through the cables 14a, 14b, and 14c, respectively, are set to approximately 200 μs, for example. By measuring the currents $I_a(t)$, $I_b(t)$, and $I_c(t)$ flowing through the cables 14a, 14b, and 14c at such time intervals, data of the current waveforms $I_a(t)$, $I_b(t)$, and $I_c(t)$ having a sufficient time resolution can be obtained.

Figure 16:
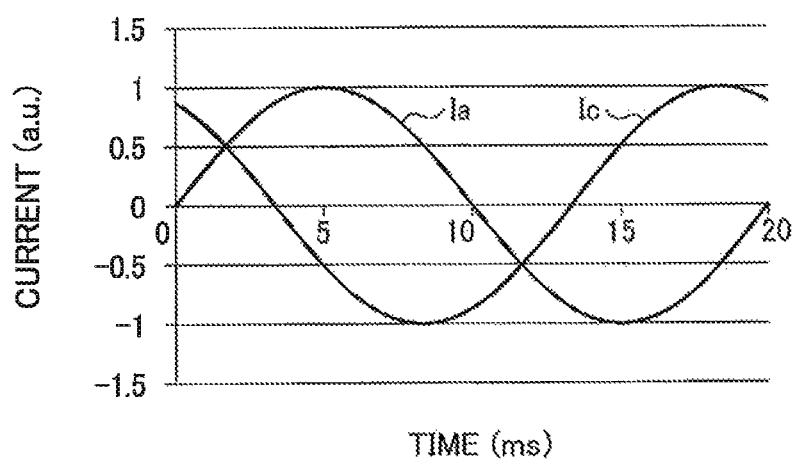
FIG. 16 is a graph illustrating current waveforms.

FIG. 16 is a graph illustrating current waveforms. In FIG. 16, $I_a$ represents the current of the a-phase, and $I_c$ represents the current of the c-phase.

As will be described later in the specification, when computing a three-phase A.C. power P, the current $I_a$ of the a-phase and the current $I_c$ of the c-phase are used for the computation, and the current $I_b$ of the b-phase is not used for the computation, for example. For this reason, the current $I_b$ of the b-phase does not need to be measured. In FIG. 16, the illustration of the current waveform of the b-phase is omitted for the sake of convenience.

The current waveforms of the a-phase and the c-phase become as illustrated in FIG. 16, for each of the grounding types employing the Y-connection, the Δ-connection, and the V-connection.

The processing unit 26 stores the acquired data of the current waveforms $I_a(t)$, $I_b(t)$, and $I_c(t)$ in the storage unit 39.

The measurements of the current waveforms $I_a(t)$, $I_b(t)$, and $I_c(t)$ by the current waveform measuring units 38a, 38b, and 38c, respectively, are controlled by the processing unit 36. The processing unit 36 controls the voltage waveform measuring units 32a, 32b, and 32c, and the current waveform measuring units 38a, 38b, and 38c, in order to synchronize the measurements of the voltage waveforms $X_a(t)$, $X_b(t)$, and $X_c(t)$ and the measurements of the current waveforms $I_a(t)$, $I_b(t)$, and $I_c(t)$. The current waveform measuring units 38a, 38b, and 38c acquire the data of the current waveforms $I_a(t)$, $I_b(t)$, and $I_c(t)$ according to instructions from the processing unit 36, and output the acquired data of the current, waveforms $I_a(t)$, $I_b(t)$, and $I_c(t)$ to the processing unit 36.

The power computing unit 46 computes the three-phase A.C. power (active power) to be supplied to the load, in a manner to be described later in the specification, based on the data of the voltage waveforms $X_a(t)$, $X_b(t)$, and $X_c(t)$ and the data of the current waveforms $I_a(t)$, $I_b(t)$, and $I_c(t)$.

Data of the three-phase A.C. power P computed by the power computing unit 46 is stored in the storage unit 39.

The communication unit 40 is connected to the processing unit 36. The communication unit 40 can transmit and receive data between the A.C. power measuring apparatus and another apparatus (not illustrated), including the data of the three-phase A.C. power P computed by the power computing unit 46. For example, the communication unit 40 may transmit and receive the data between the A.C. power measuring apparatus and the other apparatus via a network, such as a LAN (Local Area Network), the Internet, or the like.

Figure 17:
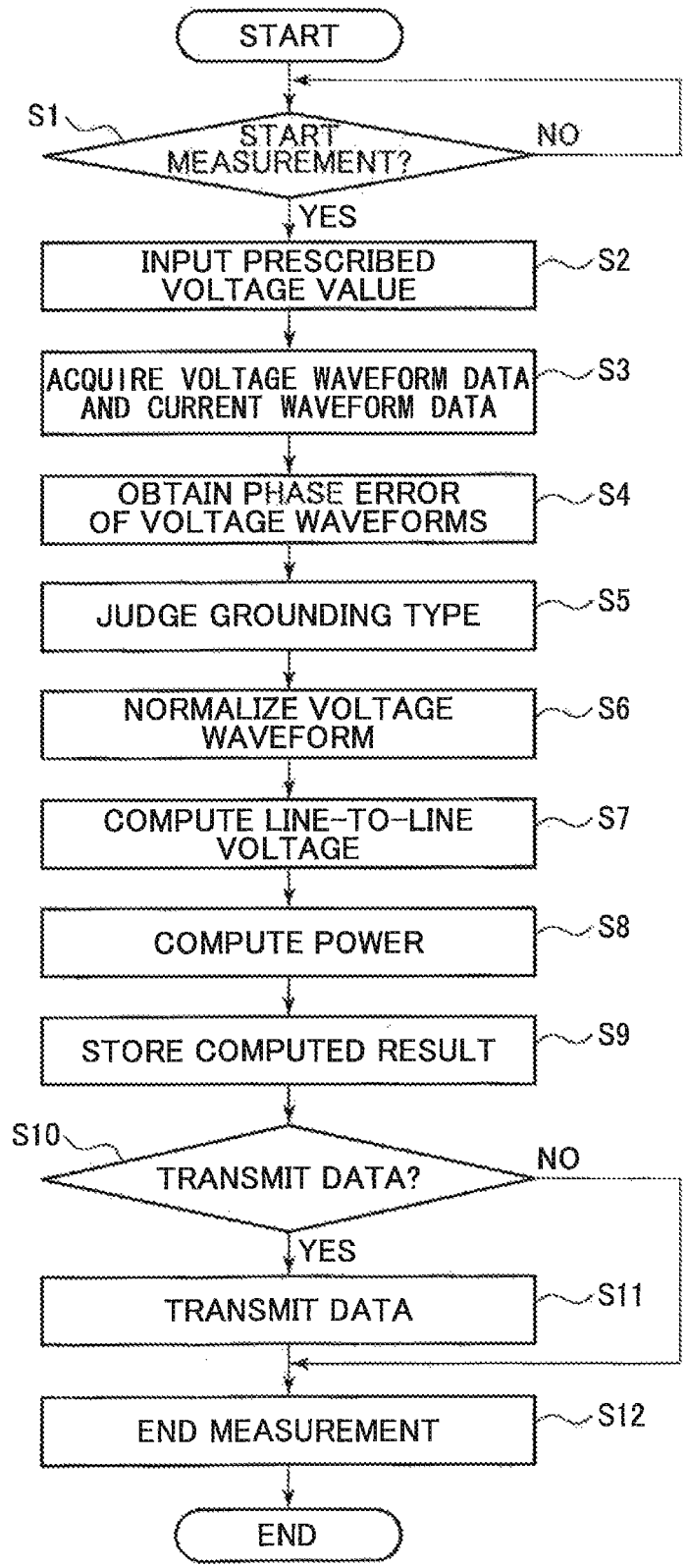
FIG. 17 is a flow chart illustrating an A.C. power measuring method in one embodiment.

Next, a description will be given of the A.C. power measuring method in one embodiment. FIG. 17 is a flow chart illustrating the A.C. power measuring method in this embodiment.

A description will be given of an example in which the three-phase A.C. power is measured.

First, when measuring the power, an operator turns ON a measurement switch (not illustrated) provided on the A.C. power measuring apparatus (step S1). As a result, the power measurement can be started.

Next, the operator inputs a prescribed voltage value $E_{eff}$ (step S2). The prescribed voltage value $E_{eff}$ is set to an effective value, for example. In the case of the three-phase A.C., the prescribed voltage value $E_{eff}$ is 200 V, for example. The prescribed voltage value $E_{eff}$ is input from an input device (not illustrated). The input prescribed voltage value $E_{eff}$ is input to the processing unit 36. The input prescribed voltage value $E_{eff}$ may be displayed on a display device, for example.

The prescribed voltage value $E_{eff}$ is not limited to that described above. For example, the prescribed voltage value $E_{eff}$ may be input according to a prescribed voltage of the power supplied to the cables 14a, 14b, and 14c.

The processing unit 36 controls the voltage waveform measuring units 32a, 32b, and 32c to acquire the data of the voltage waveforms $X_a(t)$, $X_b(t)$, and $X_c(t)$, respectively, and controls the current waveform measuring units 38a, 38b, and 38c to acquire the data of the current waveforms $I_a(t)$, $I_b(t)$, and $I_c(t)$, respectively (step S3). The acquired data of the voltage waveforms $X_a(t)$, $X_b(t)$, and $X_c(t)$, and the acquired data of the current waveforms $I_a(t)$, $I_b(t)$, and $I_c(t)$ are output to the processing unit 36. A time in which the data of the voltage waveforms $X_a(t)$, $X_b(t)$, and $X_c(t)$ and the data of the current waveforms $I_a(t)$, $I_b(t)$, and $I_c(t)$ are acquired is set to at least a time amounting to one period or more. In order to improve the measuring accuracy, it is preferable to acquire the data of the voltage waveforms $X_a(t)$, $X_b(t)$, and $X_c(t)$ and the data of the current, waveforms $I_a(t)$, $I_b(t)$, and $I_c(t)$ in a time amounting to a plurality of periods. The processing unit 36 stores the acquired data of the voltage waveforms $X_a(t)$, $X_b(t)$, and $X_c(t)$ and the acquired data of the current waveforms $I_a(t)$, $I_b(t)$, and $I_c(t)$ in the storage unit 39.

When the current $I_a$ of the a-phase and the current $I_c$ of the c-phase are used to compute the power P, and the current $I_b$ of the b-phase is not used for this computation, the current $I_b$ of the b-phase does not need to be measured.

Next, the phase errors of the voltage waveforms $X_a(t)$, $X_b(t)$, and $X_c(t)$ amongst each of the phases is obtained (step S4). The phase errors of the voltage waveforms $X_a(t)$, $X_b(t)$, and $X_c(t)$ amongst each of the phases may be obtained by comparing the positions of the zero-crossing points of the voltage waveforms $X_a(t)$, $X_b(t)$, and $X_c(t)$, for example. The average value of the voltage waveforms $X_a(t)$, $X_b(t)$, and $X_c(t)$ is regarded as being the zero point, and the point where the part of the positive slope of the voltage waveform and the zero point intersect is regarded as the zero-crossing point. The phase errors of the voltage waveforms $X_a(t)$, $X_b(t)$, and $X_c(t)$ amongst each of the phases can be obtained by dividing the positional differences (time differences) of the zero-crossing points by the period, in order to convert the positional differences of the zero-crossing points into the phase errors.

Next, the grounding type judging unit 42 judges the grounding type (step S5). As described, above, the grounding type may be judged based on the phase errors of the voltage waveforms $X_a(t)$, $X_b(t)$, and $X_c(t)$, for example. In a case in which the phase error between the voltage waveform $X_a(t)$ of the first cable 14a and the voltage waveform $X_b(t)$ of the second cable 14b is 120°, and the phase error between the voltage waveform $X_a(t)$ of the first cable 14a and the voltage waveform $X_c(t)$ of the third cable 14c is 240°, for example, the grounding type is judged as being the grounding type employing the Y-connection. In addition, in a case in which the voltage of the second cable 14b is 0 V and the phase error between the voltage waveform $X_a(t)$ of the first cable 14a and the voltage waveform $X_c(t)$ of the third cable 14c is 300°, for example, the grounding type is judged as being the grounding type employing the Δ-connection. Further, in a case in which the phase error between the voltage waveform $X_a(t)$ of the first cable 14a and the voltage waveform $X_b(t)$ of the second cable 14b is 180°, and the phase error between the voltage waveform $X_a(t)$ of the first cable 14a and the voltage waveform $X_c(t)$ of the third cable 14c is 270°, for example, the grounding type is judged as being the grounding type employing the V-connection.

Based on the acquired phase errors of the voltage waveforms $X_a(t)$, $X_b(t)$, and $X_c(t)$ amongst each of the phases, the grounding type of the three-phase A.C. can be judged (refer to FIG. 8).

Next, the voltage waveform normalization unit 44 normalizes the voltage waveforms $X_a(t)$, $X_b(t)$, and $X_c(t)$ according to the grounding type (step S6).

In the case in which the grounding type is the grounding type employing the Y-connection or the V-connection, the amplitude of the b-phase may be used as the reference, for example, and the normalization may be performed according to following formulas (6) and (7), for example.

$$X_a'(t)=V_{ratio\_a} \times (|X_b|/|X_a|) \times X_a(t) \tag{6}$$

$$X_c'(t)=V_{ratio\_c} \times (|X_b|/|X_c|) \times X_c(t) \tag{7}$$

In the above formula (6), $|X_a|$ denotes the amplitude of the acquired voltage waveform $X_a(t)$ of the a-phase, and $|X_b|$ denotes the amplitude of the acquired voltage waveform $X_b(t)$ of the b-phase. In the above formula (7), $|X_c|$ denotes the amplitude of the acquired voltage waveform $X_C(t)$ of the c-phase. Further, in the above formulas (6) and (7), $X_a'(t)$ denotes the normalized voltage waveform of the a-phase, and $X_c'(t)$ denotes the normalized voltage waveform of the c-phase.

In the case of the grounding type employing the Y-connection, the value of the amplitude ratio $V_{ratio\_a}$ is 1, and the value of the amplitude ratio $V_{ratio\_c}$ is 1.

Moreover, in the case of the grounding type employing the V-connection, the value of the amplitude ratio $V_{ratio\_a}$ is 1, and the value of the amplitude ratio $V_{ratio\_c}$ is $\sqrt{3}$.

In the case in which the grounding type is the grounding type employing the Δ-connection and the b-phase is grounded, the amplitude of the b-phase cannot be used as the reference.

In this case in which the amplitude of the b-phase cannot be used as the reference, the amplitude of the a-phase, for example, may be used as the reference. When the amplitude of the a-phase is used as the reference, the normalized voltage waveform $X_c'(t)$ of the c-phase can be represented by the following formula (8).

$$X_c'(t)=V_{ratio\_c} \times (|X_a|/|X_c|) \times X_c(t) \tag{8}$$

In the formula (8) above, $V_{ratio\_c}$ represents the amplitude ratio of the c-phase with respect to the a-phase.

Accordingly, the voltage waveforms $X_a(t)$, $X_b(t)$, and $X_c(t)$ are normalized so that the amplitude ratio of each of the phases becomes in accordance with the grounding type (refer to FIG. 9).

In this specification, the amplitude ratio in accordance with the grounding type refers to a predetermined prescribed amplitude ratio that is determined for each grounding type, that is, a standard (or regular) amplitude ratio that is determined for each grounding type. More particularly, the amplitude ratio according to the grounding type is 1:1:1 for the grounding type employing the Y-connection, 1:0:1 for the grounding type employing the Δ-connection, and 1:1:√3 for the grounding type employing the V-connection.

Next, the line-to-line voltage computing unit 46 computes line-to-line voltage waveforms $Z_{ab}(t)$ and $Z_{cb}(t)$ of the cables 14a, 14b, and 14c amongst each of the phases (step S7). A description will be given of an example in which the line-to-line voltage waveforms $Z_{ab}(t)$ and $Z_{cb}(t)$ are computed with reference to the b-phase, The line-to-line voltage waveform $Z_{ab}(t)$ between the a-phase and the b-phase can be represented by the following formula (9).

$$Z_{ab}(t)=X_a'(t)-X_b(t) \tag{9}$$

The line-to-line voltage waveform $Z_{cb}(t)$ between the b-phase and the c-phase can be represented by the following formula (10).

$$Z_{ab}(t)=X_c'(t)-X_b(t) \tag{10}$$

Next, the power computing unit 50 computes the three-phase A.C. power (active power) P to be supplied to the load, in the following manner, using the data of the line-to-line voltage waveforms $Z_{ab}(t)$ and $Z_{cb}(t)$ (step S8).

First, the power computing unit 50 obtains a first value $P_{ab}$ in the following manner, using the data of the line-to-line voltage $Z_{ab}(t)$.

That is, the power computing unit 50 first computes an effective value $Z_{ab,eff}$ of the line-to-line voltage $Z_{ab}(t)$, based on the data of the line-to-line voltage $Z_{ab}(t)$.

In addition, the power computing unit 50 obtains an average value $P_{0,ab}$ of a product of the line-to-line voltage $Z_{ab}(t)$ and the current $I_a(t)$ flowing through the cable 14a. The average value $P_{0,ab}$ is represented, by the following formula (11).

$$P_{0,ab}=(1/N)\Sigma(Z_{ab}(t) \times I_a(t)) \tag{11}$$

In the above formula (11), a symbol (summation notation) Σ represents a summation, and N represents a number of data to be summed. The summation is performed for the data amounting to one period, for example. Of course, the data amounting to a plurality of periods may be summed, and an average value of the summation may be used instead.

The current $I_a$ flowing through the cable 14a is indicated by the current waveform data acquired by the current waveform measuring unit 38a.

The first value $P_{ab}$ can be represented by the following formula (12), where $E_{eff}$ denotes the prescribed voltage value described above.

$$P_{ab}=P_{0,ab} \times E_{eff}/Z_{ab,eff} \tag{12}$$

In addition, the power computing unit 50 obtains a second value $P_{cb}$ in the following manner, using the data of the line-to-line voltage $Z_{cb}(t)$.

That is, the power computing unit 50 first computes an effective value $Z_{cb,eff}$ of the line-to-line voltage $Z_{cb}(t)$, based on the data of the line-to-line voltage $Z_{cb}(t)$.

In addition, the power computing unit 50 obtains an average value $P_{0,cb}$ of a product of the line-to-line voltage $Z_{cb}(t)$ and the current $I_c(t)$ flowing through the cable 14c. The average value $P_{0,cb}$ is represented, by the following formula (13).

$$P_{0,cb}=(1/N)\Sigma(Z_{cb}(t) \times I_c(t)) \tag{13}$$

In the above formula (13), a symbol (summation notation) Σ represents a summation, and N represents a number of data to be summed. The summation is performed for the data amounting to one period, for example. Of course, the data amounting to a plurality of periods may be summed, and an average value of the summation may be used instead.

The current $I_c$ flowing through the cable 14c is indicated by the current waveform data acquired by the current waveform measuring unit 38c.

The second value $P_{cb}$ can be represented by the following formula (14), where $E_{eff}$ denotes the prescribed voltage value described above.

$$P_{cb}=P_{0,cb} \times E_{eff}/Z_{cb,eff} \tag{14}$$

Next, the power computing unit 50 obtains the value of the three-phase A.C. power P.

The three-phase A.C. power P can be represented by the following formula (15).

$$P=P_{ab}+P_{cb} \tag{15}$$

In the above formula (15), the power P is the only parameter having a physical significance or meaning by itself. The first value $P_{ab}$ and the second value $P_{cb}$ are merely values that are computed for the sake of convenience when obtaining the power P. Each of the first value $P_{ab}$ and the second value $P_{cb}$ does not have a physical significance or meaning by itself.

The power computing unit 50 computes the three-phase A.C. power P in the above described manner.

Hence, the power P supplied by the set of three cables 14a, 14b, and 14c is computed by the power computing unit 50. The data of the power P computed by the power computing unit 50 is stored in the storage unit 39 (step S9).

Next, when transmitting the computed result to another apparatus that is not illustrated (step S10), the communication unit 40 transmits the data of the power P computed by the processing unit 36 to the other apparatus that is not illustrated (step S11).

When the operator turns OFF the measurement, switch, the measurement ends (step S12). The processing unit 36 may display the measurement results on the display device (not illustrated).

The A.C. power measuring method in this embodiment is completed by the processes described above.

According to this embodiment, the acquired voltage waveforms of each of the phases are normalized so that the amplitude ratio of each of the phases becomes in accordance with the grounding type of the three-phase A.C. Hence, inconsistencies in the electrostatic capacitance between the electrode 26 of the clamp part 11 and the conductor wire 16 of the cable 14 amongst each of the phases can be eliminated. For this reason, this embodiment can accurately measure the A.C. power by performing the contactless measurement with respect to the conductor wires 16 of the cables 14.

Modification

Various modifications of the above described embodiment are possible.

For example, the embodiment is not limited to the above described case in which the grounding type is judged based on the phase errors of the voltage waveforms $X_a(t)$, $X_b(t)$, and $X_c(t)$ amongst each of the phases. For example, the grounding type may be judged based on the amplitude ratio of the voltage waveforms $X_a(t)$, $X_b(t)$, and $X_c(t)$ of each of the phases. As illustrated in FIG. 9, the amplitude ratio of the voltage waveforms $X_a(t)$, $X_b(t)$, and $X_c(t)$ of each of the three phases becomes 1:1:1 in the case of the grounding type employing the Y-connection. Accordingly, the grounding type may be judged as being the grounding type employing the Y-connection when the amplitude ratio of the voltage waveforms $X_a(t)$, $X_b(t)$, and $X_c(t)$ of each of the three phases is 1:1:1. In addition, as illustrated in FIG. 9, the amplitude ratio of the voltage waveforms $X_a(t)$, $X_b(t)$, and $X_c(t)$ of each of the three phases becomes 1:0:1 in the case of the grounding type employing the Δ-connection. Accordingly, the grounding type may be judged as being the grounding type employing the Δ-connection when the amplitude ratio of the voltage waveforms $X_a(t)$, $X_b(t)$, and $X_c(t)$ of each of the three phases is 1:0:1. Further, as illustrated in FIG. 9, the amplitude ratio of the voltage waveforms $X_a(t)$, $X_b(t)$, and $X_c(t)$ of each of the three phases becomes 1:1:√3 in the case of the grounding type employing the V-connection. Accordingly, the grounding type may be judged as being the grounding type employing the V-connection when the amplitude ratio of the voltage waveforms $X_a(t)$, $X_b(t)$, and $X_c(t)$ of each of the three phases is 1:1:√3.

Although the embodiment uses the clamp part 11 which can detect both the voltage and the current, the method of detecting the voltage and the current is not limited to such. For example, the voltage may be detected using a clamp part for measuring the voltage, and the current may be may be detected using a separate clamp part for measuring the current.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An A.C. power measuring apparatus comprising:
    a voltage detecting unit configured to detect voltage waveforms of each of phases of a set of three insulated cables for supplying a three-phase A.C. power to a load, by performing a contactless measurement by electrostatic capacitance coupling, without making contact with the insulated cable;
    a current detecting unit configured to detect current waveforms of the set of three insulated cables, by performing a contactless measurement by electromagnetic induction coupling, without making contact with the insulated cable; and
    a processing unit configured to compute a power to be supplied to the load, based on line-to-line voltage waveforms, the current waveforms, and prescribed voltage values, by normalizing the voltage waveforms of each of the phases so that an amplitude ratio of the voltage waveforms becomes in accordance with a grounding type of the three-phase A.C. power, and obtaining the line-to-line voltages of the set of three insulated cables based on the normalized voltage waveforms of each of the phases.

2. The A.C. power measuring apparatus as claimed in claim 1, wherein the processing unit judges the grounding type of the three-phase A.C. power based on the voltage waveforms of each of the phases, and normalizes the voltage waveforms of each of the phases according to the judged grounding type.

3. The A.C. power measuring apparatus as claimed in claim 2, wherein the processing unit judges the grounding type based on phase errors of the voltage waveforms amongst each of the phases.

4. The A.C. power measuring apparatus as claimed in claim 2, wherein the processing unit judges the grounding type based on an amplitude ratio of the voltage waveforms of each of the phases.

5. An A.C. power measuring method comprising:
    measuring voltage waveforms of each of phases of a set of three insulated cables for supplying a three-phase A.C. power to a load, by performing a contactless measurement by electrostatic capacitance coupling, without making contact with the insulated cable;
    measuring current waveforms of the set of three insulated cables, by performing a contactless measurement, by electromagnetic induction coupling, without making contact with the insulated cable; and
    normalizing the voltage waveforms of each of the phases so that an amplitude ratio of the voltage waveforms becomes in accordance with a grounding type of the three-phase A.C. power;
    obtaining line-to-line voltages of the sat of three insulated cables based on the normalized voltage waveforms of each of the phases; and
    computing a power to foe supplied to the load, based on the line-to-line voltage waveforms, the current waveforms, and prescribed voltage values.

6. The A.C. power measuring method as claimed in claim 5, further comprising:
    judging the grounding type of the three-phase A.C. power based on the voltage waveforms of each of the phases,
    wherein the normalizing normalizes the voltage waveforms of each of the phases according to the judged grounding type.

7. The A.C. power measuring method as claimed in claim 6, wherein the judging judges the grounding type based on phase errors of the voltage waveforms amongst each of the phases.

8. The A.C. power measuring method as claimed in claim 6, wherein the judging judges the grounding type based on an amplitude ratio of the voltage waveforms of each of the phases.

* * * * *